(12) United States Patent
Zhou et al.

(10) Patent No.: US 12,276,749 B2
(45) Date of Patent: Apr. 15, 2025

(54) RADAR APPARATUS AND MOBILE PLATFORM

(71) Applicant: HUAWEI TECHNOLOGIES CO., LTD., Guangdong (CN)

(72) Inventors: Qin Zhou, Shanghai (CN); Chenyi Jin, Shenzhen (CN)

(73) Assignee: Shenzhen Yinwang Intelligent Technologies Co., Ltd., Shenzhen (CN)

(*) Notice: Subject to any disclaimer, the term of this patent is extended or adjusted under 35 U.S.C. 154(b) by 359 days.

(21) Appl. No.: 17/868,197

(22) Filed: Jul. 19, 2022

(65) Prior Publication Data

US 2022/0349988 A1     Nov. 3, 2022

Related U.S. Application Data

(63) Continuation of application No. PCT/CN2021/072733, filed on Jan. 19, 2021.

(30) Foreign Application Priority Data

Jan. 20, 2020  (CN) .......................... 202010067460.1
Nov. 11, 2020  (CN) .......................... 202011256682.4

(51) Int. Cl.
  *G01S 7/02*     (2006.01)
  *G01S 13/931*   (2020.01)
  *H05K 7/20*     (2006.01)

(52) U.S. Cl.
  CPC ............ *G01S 7/027* (2021.05); *G01S 13/931* (2013.01); *H05K 7/2039* (2013.01)

(58) Field of Classification Search
  CPC ........ G01S 7/027; G01S 13/931; G01S 7/032; H05K 7/2039; H05K 1/144
  See application file for complete search history.

(56) References Cited

U.S. PATENT DOCUMENTS

| | | | |
|---|---|---|---|
| 11,709,223 B2* | 7/2023 | Schulte | G01S 7/032 |
| | | | 342/175 |
| 2008/0062038 A1* | 3/2008 | Ouchi | G01S 7/032 |
| | | | 342/175 |

(Continued)

FOREIGN PATENT DOCUMENTS

| | | |
|---|---|---|
| CN | 106169652 A | 11/2016 |
| CN | 207697671 U  * | 8/2018 |

(Continued)

OTHER PUBLICATIONS

CN_207697671_U_I_translate.pdf—translation of CN_207697671_U (Year: 2018).*

(Continued)

*Primary Examiner* — Olumide Ajibade Akonai
*Assistant Examiner* — Yonghong Li
(74) *Attorney, Agent, or Firm* — Fish & Richardson P.C.

(57) ABSTRACT

Example radar apparatus and mobile platforms are described. One example radar apparatus includes a housing, an antenna board, and a connector. The antenna board is disposed in the housing. The antenna board has a first board surface and a second board surface that are disposed opposite each other. The first board surface is used to receive and transmit signals. The connector is disposed in the housing, and is configured to connect to another component outside the housing. The connector has an electrical connection structure. The electrical connection structure is electrically connected to the antenna board, and the electrical connection structure is located on a side of the second board surface.

20 Claims, 5 Drawing Sheets

(56) References Cited

U.S. PATENT DOCUMENTS

| 2016/0033621 A1* | 2/2016 | Ottenhues | G01S 7/032 |
| | | | 342/175 |
| 2019/0041494 A1* | 2/2019 | Roger | G01S 7/352 |
| 2019/0159371 A1* | 5/2019 | Grinsteinner | G01S 7/4813 |
| 2020/0221599 A1* | 7/2020 | Mai | H05K 5/0052 |

FOREIGN PATENT DOCUMENTS

| CN | 208044062 U | 11/2018 |
| CN | 208350994 U | 1/2019 |
| CN | 208506239 U | 2/2019 |
| CN | 109804263 A | 5/2019 |
| CN | 110596648 A | 12/2019 |
| DE | 102018105702 A1 | 9/2019 |
| EP | 2905632 A1 | 8/2015 |
| EP | 3096400 A1 | 11/2016 |
| EP | 3017503 B1 | 7/2017 |
| WO | 2018069244 A1 | 4/2018 |

OTHER PUBLICATIONS

Extended European Search Report in European Appln No. 21744314.2, dated Dec. 19, 2022, 9 pages.

International Search Report and Written Opinion in International Appln. No. PCT/CN2021/072733, mailed on Apr. 19, 2021, 21 pages (with English translation).

* cited by examiner

RADAR APPARATUS AND MOBILE PLATFORM

CROSS-REFERENCE TO RELATED APPLICATIONS

This application is a continuation of International Application No. PCT/CN2021/072733, filed on Jan. 19, 2021, which claims priority to Chinese Patent Application No. 202010067460.1, filed on Jan. 20, 2020 and Chinese Patent Application No. 202011256682.4, filed on Nov. 11, 2020, all of which are hereby incorporated by reference in their entireties.

TECHNICAL FIELD

This application relates to the field of radar technologies, and in particular, to a radar apparatus and a mobile platform.

BACKGROUND

Currently, a vehicle having an autonomous driving function gradually becomes a main development direction of the automobile industry. To implement the autonomous driving function, a radar apparatus has become an indispensable key component in the vehicle. In an actual application, a vehicle-mounted millimeter-wave radar apparatus requires high working performance, a high protection level, and a specific miniaturized and integrated design. The millimeter-wave radar apparatus mainly transmits a millimeter wave (for example, an electromagnetic wave whose frequency is between 30 GHz and 300 GHz and whose wavelength is between 1 mm and 10 mm) to the outside through an antenna. In an actual application, a radar apparatus needs to be equipped with a connector, so as to electrically connect the radar apparatus to another component (for example, a vehicle-mounted computer). However, because a position for disposing a connector is improper in a current radar apparatus, an electrical connection structure in the connector affects working performance of an antenna. Alternatively, connectors in some radar apparatuses occupy disposing space of antennas. As a result, a size of the antenna is reduced, and this is not conducive to improvement of working performance of the antenna.

SUMMARY

This application provides a radar apparatus and a mobile platform that can effectively ensure working performance of an antenna and a board disposing area.

On one hand, this application provides a radar apparatus, including a housing, a connector, and an antenna board located in the housing. The antenna board may transmit an electromagnetic wave to the outside or receive an electromagnetic wave from the outside by using the housing. The housing may provide airtight space for the antenna board, so as to prevent external impurities such as dust and water vapor from affecting the antenna board. The antenna board has a first board surface and a second board surface that are disposed opposite each other, and the first board surface is used to receive and transmit signals. The connector has an electrical connection structure, and the electrical connection structure is configured to establish an electrical connection between another component outside the housing and the antenna board. After an antenna board assembly is installed in the housing, the electrical connection structure in the connector is located on a side of the second board surface.

In the antenna board, one side used for the first board surface is used to receive and transmit signals. Therefore, that the electrical connection structure is disposed on the side of the second board surface can prevent the electrical connection structure from obstructing signal receiving and receiving of the antenna board. In addition, there is no position interference between the electrical connection structure and the antenna board, which facilitates improving a board disposing area of the antenna board.

When the electrical connection structure in the connector is specifically disposed, the electrical connection structure may be a mechanical part that can implement reliable electrical connection, such as a metal contact, a spring, or a pin.

In addition, in specific implementation, to facilitate quick connection between the connector and the antenna board, a conductive structure such as a pad and a via may be disposed on the second board surface of the antenna board. In a specific application, a type of the conductive structure may be adaptively adjusted according to an actual requirement. This is not limited herein.

In specific implementation, the housing may have various structures.

For example, a radome, an insulation part, and a metal heat dissipation part in a bottom housing may be independent mechanical part. An entire housing may be assembled through a connecting piece (for example, a screw) or a welding process, and the like between the radome and the insulation part, between the radome and the metal heat dissipation part, and between the insulation part and the metal heat dissipation part. Alternatively, the radome and the insulation part in the bottom housing may be an integrally molded injection part, and the metal heat dissipation part may be fixedly connected to the insulation part or the radome through a connector, so as to assemble the entire housing. Alternatively, a secondary injection molding process and the like may be used between the metal heat dissipation part and the insulation part to form an integrated structure or the like.

Specifically, in a solution provided in this application, the radome, the insulation part, and the metal heat dissipation part may be mutually independent components. In specific implementation, the insulation part may be of a frame structure. For example, the insulation part may include a bottom board and a side board located at an edge of the bottom board, a through-hole structure may be disposed in the bottom board, the metal heat dissipation part may be fixedly connected to the bottom board, and the metal heat dissipation part may block the through-hole structure, thereby improving airtightness of the connection between the insulation part and the metal heat dissipation part.

In specific implementation, the insulation part and the metal heat dissipation part may be connected in various manners. For example, a first connection part may be disposed in the insulation part, and a second connection part may be disposed in the metal heat dissipation part. After the first connection part and the second connection part are connected in a sealed manner, the insulation part and the metal heat dissipation part may be connected in a sealed manner. Specifically, the first connection part may be a flange structure or a groove structure disposed at an edge of the through-hole structure, and the second connection part may be a groove structure or a flange structure disposed at an edge of the metal heat dissipation part. After the flange structure or the groove structure in the insulation part is closely matched with the groove structure or the flange structure in the metal heat dissipation part, the insulation part can be connected to the metal heat dissipation part in a sealed manner. In specific implementation, in order to ensure stability of the connection between the insulation part and the metal heat dissipation part, the first connection part in the insulation part may be heated to be in a molten state by using a laser welding process or the like, so that the first connection part and the second connection part are bonded, thereby improving stability and airtightness of the connection between the insulation part and the metal heat dissipation part.

In some implementations, the insulation part and the metal heat dissipation part may also be fixedly connected and connected in sealed manner in a form such as a threaded connection, clamping, or bonding.

For example, in an embodiment solution provided in this application, a clamping connection is used between a radome and the insulation part. Specifically, a protrusion may be disposed in the radome, and a buckle may be disposed in the insulation part. When the radome is connected to the insulation part, the protrusion in the radome and the buckle in the insulation part are fastened to each other, thereby implementing a fixed connection between the radome and the insulation part. In specific implementation, a quantity and positions of protrusions may be diversified. In addition, a quantity and positions of the buckles may be adaptively adjusted based on the quantity and the positions of the protrusions. In addition, in some implementations, the radome may also be fixedly connected to the insulation part in a form of bonding, threaded connection, welding, or the like. This is not specifically limited in this application.

In addition, to ensure airtightness of the connection between the radome and the insulation part, in some embodiment solutions, a groove may be disposed on an upper edge of the insulation part, and a flange may be disposed on a lower edge of the radome. When the radome and the insulation part are fastened to each other, the flange in the radome is embedded into the groove in the insulation part, and the flange may closely press against an inner wall of the groove, so as to ensure airtightness of the connection between the radome and the insulation part.

In some implementations, to improve airtightness of the connection between the radome and the insulation part, a sealing ring may be disposed between the radome and the insulation part. Specifically, the sealing ring may be disposed in the groove. After the radome and the insulation part are fastened to each other, the flange in the radome is embedded into the groove in the insulation part and closely presses against the sealing ring. At the same time, the flange presses the sealing ring, so that the sealing ring closely presses against the inner wall of the groove, thereby improving airtightness of the connection between the insulation part and the radome. In some other implementations, a joint (for example, between the flange and the groove) between the radome and the insulation part may be filled with sealant or the like, to ensure airtightness of the connection between the radome and the insulation part. In other implementations, the flange may also be disposed in the insulation part, and the groove may be disposed in the radome.

In addition, in specific implementation, positions and proportions of the metal heat dissipation part in the bottom housing may be varied.

For example, the metal heat dissipation part may be disposed directly opposite a rear end of the antenna assembly, so that heat generated by the antenna assembly can be effectively radiated or transferred to the metal heat dissipation part, thereby effectively improving a heat dissipation effect of the metal heat dissipation part on the antenna assembly. In some implementations, a contour area of the antenna assembly may not be greater than a contour area of the metal heat dissipation part, so that heat generated by the antenna assembly can be effectively radiated or transferred to the metal heat dissipation part, thereby improving a heat dissipation effect of the metal heat dissipation part on the antenna assembly.

In addition, in some embodiments, a heat emitting element (such as a controller) may be disposed on the rear end of an antenna assembly, an accommodation groove for accommodating the heat emitting element may be disposed in an inner side of the metal heat dissipation portion, thereby facilitating miniaturization of the radar apparatus. In addition, a distance between the metal heat dissipation part and the heat emitting element and a distance between the metal heat dissipation part and a circuit board can be effectively reduced, so as to reduce a heat conduction distance between the circuit board, the electronic element, and the metal heat dissipation part, thereby improving heat dissipation performance of the radar apparatus.

On the other hand, an embodiment of this application further provides a mobile platform, including an information processing system and any one of the foregoing radar apparatuses. The information processing system is configured to determine characteristic information of a detected object based on an electromagnetic wave generated by the radar apparatus and a received electromagnetic wave, where the characteristic information includes but is not limited to information such as a target distance, an orientation, a height, a speed, a posture, and even a shape. Specifically, the information processing system may accurately measure propagation time from transmitting an electromagnetic wave by the radar apparatus to receiving the electromagnetic wave reflected by the target object. Because a light speed is known, the propagation time may be converted into measurement of a distance. Therefore, a distance from the millimeter-wave radar apparatus to the target object is determined.

In an actual application, a specific type of the mobile platform is not limited. For example, the mobile platform may be a mobile platform such as a vehicle, a ship, an airplane, a train, a spacecraft, or an unmanned aerial vehicle, and is applicable to the technical solutions of this application.

DESCRIPTION OF EMBODIMENTS

To make objectives, technical solutions, and advantages of this application clearer, the following further describes this application in detail with reference to the accompanying drawings.

To facilitate understanding of a radar apparatus provided in embodiments of this application, the following first describes an application scenario of the radar apparatus.

Figure 1:
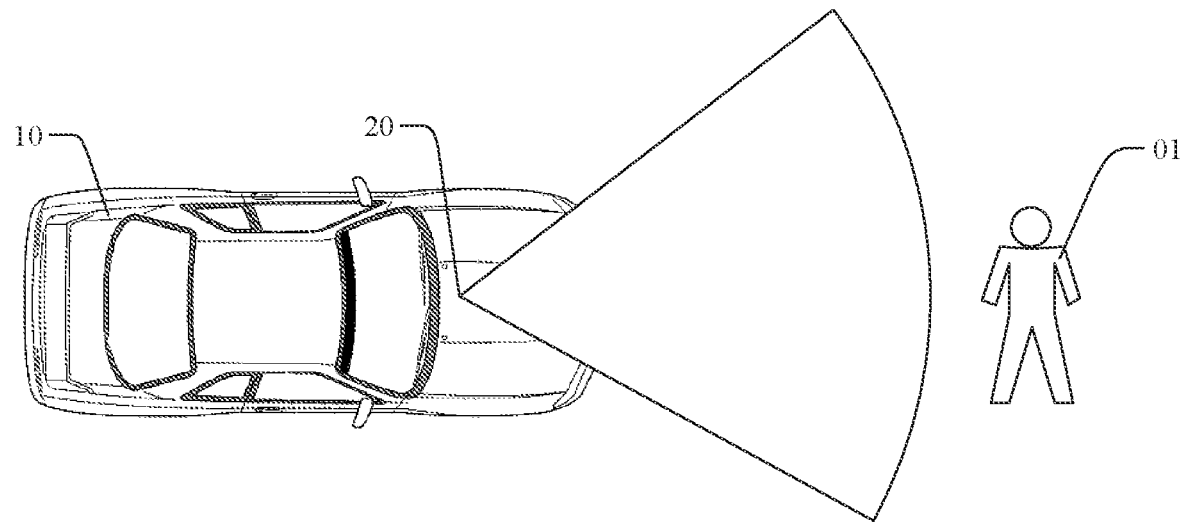
FIG. 1 is a diagram of an application scenario of a millimeter-wave radar apparatus according to an embodiment of this application.

As shown in FIG. 1, in the field of vehicles (such as passenger vehicles, logistics vehicles, and robots), a radar apparatus 20 may be installed in a vehicle 10, so that the vehicle 10 can detect a road condition or an environment in which the vehicle is located. The radar apparatus 20 may be classified into a millimeter-wave radar apparatus, a microwave radar apparatus, and the like based on different wavelengths of transmitted electromagnetic waves. For example, the radar apparatus 20 is a millimeter-wave radar apparatus. The millimeter-wave radar apparatus 20 can transmit an electromagnetic wave (for example, an electromagnetic wave whose frequency is between 30 GHz and 300 GHz and whose wavelength is between 1 mm and 10 mm) to a road surface or the environment. The electromagnetic wave is reflected when a target object 01 (such as a road, a pedestrian, or a vehicle) is detected. The millimeter-wave radar apparatus 20 receives the reflected electromagnetic wave, and therefore can detect the road condition or the environment. For example, the electromagnetic wave is reflected by a human body after the human body is detected through the electromagnetic wave transmitted by the millimeter-wave radar apparatus 20 in the vehicle 10. The millimeter-wave radar apparatus 20 receives the reflected electromagnetic wave, and can measure a distance between the human body and the vehicle 10 based on receiving time and sending time of the electromagnetic wave.

Figure 2:
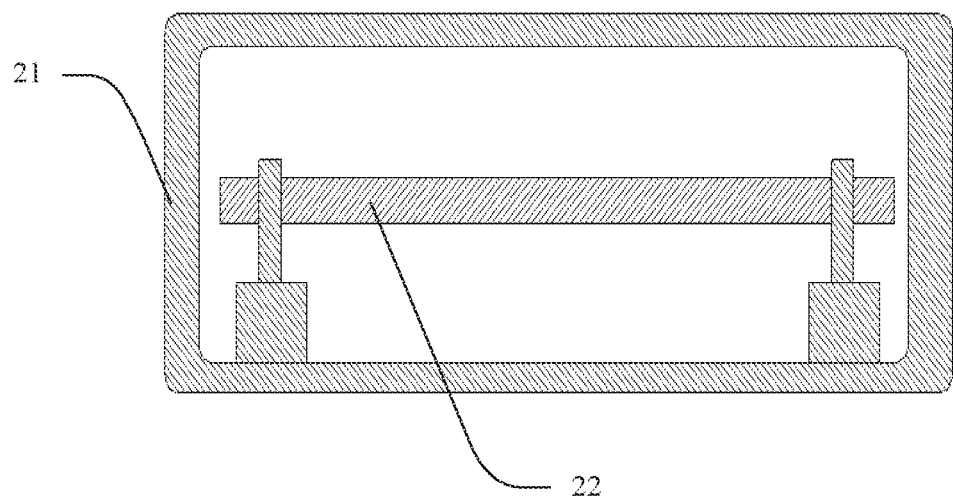
FIG. 2 is a schematic diagram of a cross-sectional structure of a millimeter-wave radar apparatus according to an embodiment of this application.

As shown in FIG. 2, the millimeter-wave radar apparatus 20 may include a housing 21, an antenna board 22 configured to generate and receive electromagnetic waves, and an electronic component (not shown in the figure) such as a drive circuit or a controller connected to the antenna board 22. The housing 21 in the millimeter-wave radar apparatus 20 may have strong airtightness, so that the millimeter-wave radar apparatus 20 has good dust-proof and water-proof performance. To prevent the housing 21 from adversely affecting transmission and reception of an electromagnetic wave, the housing 21 in a conventional millimeter-wave radar apparatus is usually made of an insulation material instead of an all-metal material, so as to avoid adverse phenomena such as shielding and blocking the electromagnetic wave. However, as power of the millimeter-wave radar apparatus 20 continuously increases, heat generated by the millimeter-wave radar apparatus 20 is increasingly large. To ensure normal working of the millimeter-wave radar apparatus 20, a heat dissipation requirement on the millimeter-wave radar apparatus 20 is increasingly high. However, the heat dissipation requirement of the millimeter-wave radar apparatus 20 cannot be met because the housing 21 made of plastic has low heat conductivity and heat dissipation.

In addition, in an actual application, the radar apparatus needs to be equipped with a connector, so as to electrically connect the radar apparatus to another component (for example, a vehicle-mounted computer). Because the connector includes an electrical connection structure, if the electrical connection structure is located on an upper side of the antenna board 22, the electromagnetic wave is obstructed, and signal receiving and transmission performance of the antenna board 22 is affected. Therefore, the connector also needs to be disposed in an appropriate position.

In view of this, embodiments of this application provide the millimeter-wave radar apparatus 20 that has a good heat dissipation effect and can ensure working performance of the antenna board 22.

To clearly understand the millimeter-wave radar apparatus 20 provided in this application, the following provides specific descriptions with reference to the accompanying drawings and specific embodiments.

Terms used in the following embodiments are merely intended to describe specific embodiments, but are not intended to limit this application. Terms "one", "a", "the foregoing", "this", and "the one" of singular forms used in this specification and the appended claims of this application are also intended to include a form like "one or more", unless otherwise specified in the context clearly. It should be further understood that, in the following embodiments of this application. "at least one" or "one or more" means one, two, or more. The term "and/or" is used to describe an association relationship between associated objects and represents that three relationships may exist. For example. A and/or B may represent the following three cases: Only A exists, both A and B exist, and only B exists, where A and B may be singular or plural. The character "/" generally represents an "or" relationship between the associated objects.

Reference to "an embodiment", "some embodiments", or the like described in this specification means that one or more embodiments of this application include a specific feature, structure, or characteristic described with reference to embodiments. Therefore, statements such as "in an embodiment", "in some embodiments", "in some other embodiments", and "in other embodiments" that appear at different places in this specification do not necessarily mean referring to a same embodiment, instead, they mean "one or more but not all of embodiments", unless otherwise specifically emphasized. The terms "include", "comprise", "have", and their variants all mean "include but are not limited to", unless otherwise specifically emphasized in other ways.

Figure 3:
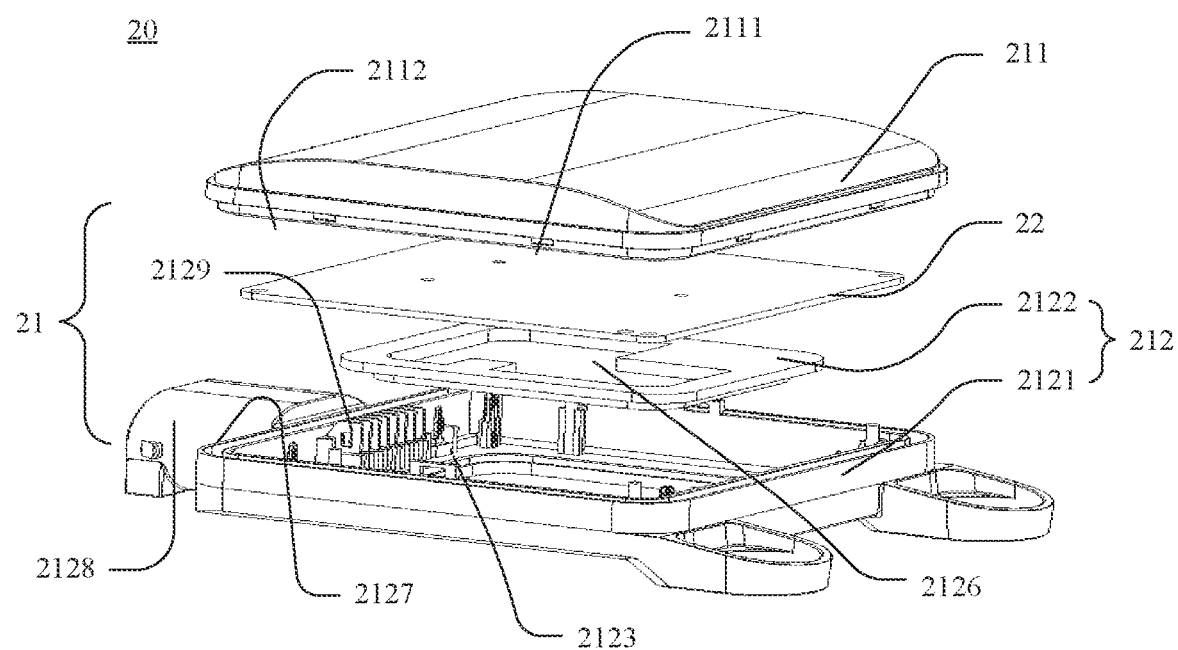
FIG. 3 is an exploded view of another millimeter-wave radar apparatus according to an embodiment of this application.
Figure 4:
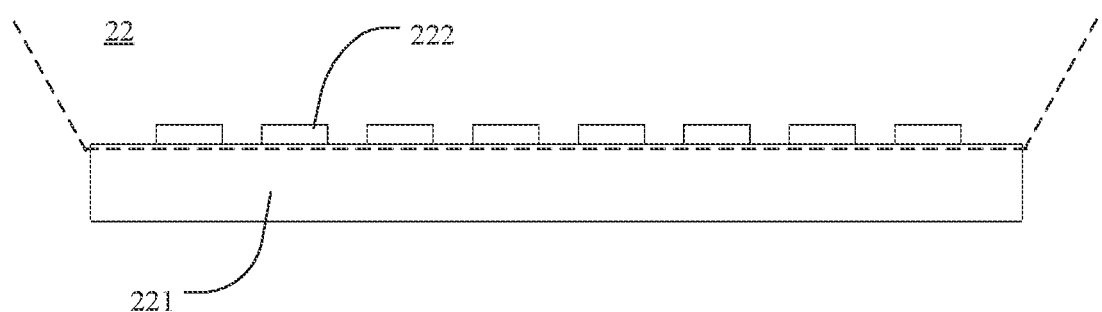
FIG. 4 is a schematic diagram of a structure of an antenna board according to an embodiment of this application.

As shown in FIG. 3, in an embodiment provided in this application, the millimeter-wave radar apparatus 20 may include the housing 21 and the antenna board 22 installed in the housing 21. Specifically, as shown in FIG. 4, the antenna board 22 may be a radio frequency board, and the radio frequency board may include a circuit board 221 and an antenna element 222 disposed on a board surface of the circuit board 221. In specific implementation, the circuit board 221 may be a printed circuit board (Printed Circuit Board, PCB), or may be a flexible printed circuit (Flexible Printed Circuit, FPC), or the like. The antenna element 222 may be disposed on the circuit board 221 by using a surface mounting process, a laser welding process, or the like. In addition, the antenna board 22 may include one antenna element 222 or may include a plurality of antenna elements 222. The plurality antenna elements 222 may be disposed on the circuit board 221 in a form of a rectangular array, a circular array, or the like, or may be disposed on the circuit board 221 in another arrangement form. This is not specifically limited in this application. In addition, a front end of the antenna board 22 mentioned below may be a transmit end or a receive end of the antenna board 22. For example, the antenna element 222 may be disposed on an upper board surface of the circuit board 221, a first board surface (upper side) of the circuit board 221 may be the front end of the antenna board 22, and a second board surface (lower side), a left side, and a right side of the circuit board 221 may be a rear end of the antenna board 22.

Figure 6:
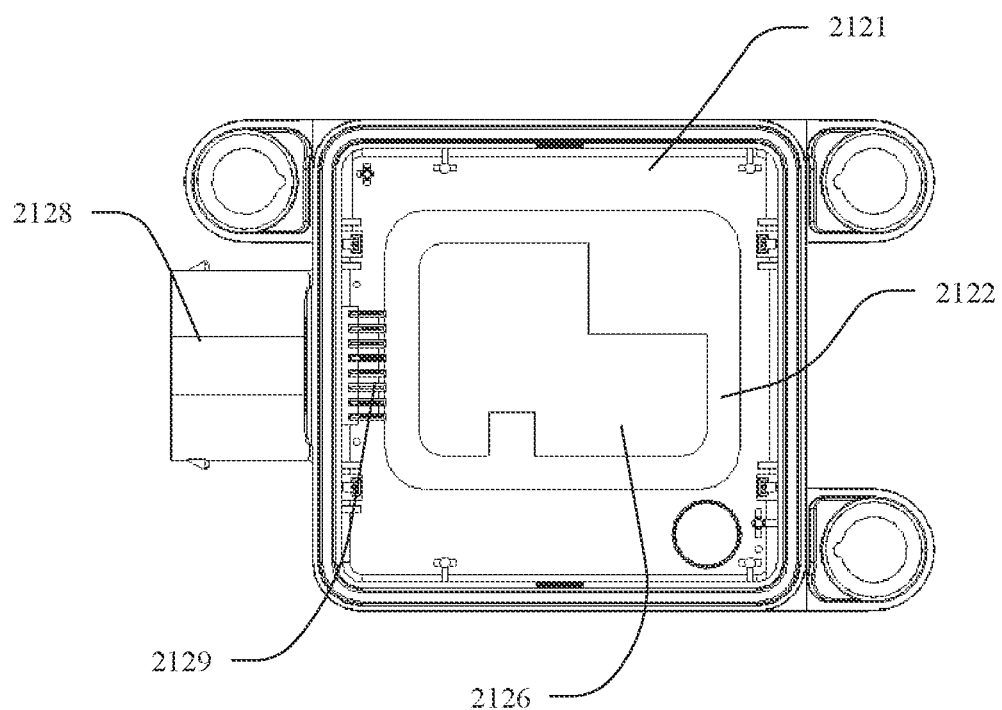
FIG. 6 is a top view of a bottom housing according to an embodiment of this application.

As shown in FIG. 3, the housing 21 may include a bottom housing 212 and a radome 211. The radome 211 and the bottom housing 212 enclose accommodation space for installing the antenna board 22, so as to protect the antenna board 22, and prevent external impurities such as dust and water vapor from entering a receptacle. In addition, to improve heat dissipation performance of the millimeter-wave radar apparatus 20, as shown in FIG. 6, in an embodiment provided in this application, the bottom housing 212 may include an insulation part 2121 and a metal heat dissipation part 2122. In specific implementation, the insulation part 2121 in the bottom housing 212 may be located at the front end of the antenna board 22, or may be located at the rear end of the antenna board 22, and the metal heat dissipation part 2122 may be located at the rear end of the antenna board 22. When the insulation part 2121 in the bottom housing 212 is located at the front end of the antenna board 22, an electromagnetic wave generated by an antenna may be transmitted to an external environment through the radome 211 or the insulation part 2121, and an electromagnetic wave in the external environment may be received by the antenna after passing through the radome 211 or the insulation part 2121. The metal heat dissipation part 2122 is disposed at the rear end of the antenna board 22, so that the metal heat dissipation part 2122 can be prevented from blocking or shielding an electromagnetic wave generated by the antenna board 22. In addition, the metal heat dissipation part 2122 (which may be made of a metal material such as copper, iron, or aluminum) has better heat conductivity than the radome 211 and the insulation part 2121 that are made of a plastic material, which can improve heat dissipation of the millimeter-wave radar apparatus 20.

In specific implementation, the housing 21 may have various structure forms.

For example, as shown in FIG. 3, in an embodiment provided in this application, the radome 211, the insulation part 2121, and the metal heat dissipation part 2122 may be components independent of each other. Specifically, the radome 211, the insulation part 2121, and the metal heat dissipation part 2122 may be separately molded, and then the radome 211, the insulation part 2121, and the metal heat dissipation part 2122 that are molded are assembled into the housing 21.

In specific implementation, the insulation part 2121 may be of a frame structure, a through hole (not shown in the figure) may be disposed at a bottom of the insulation part 2121, and the metal heat dissipation part 2122 may be fixedly connected to the bottom of the insulation part 2121, and block the through hole, so as to ensure airtightness of a connection between the insulation part 2121 and the metal heat dissipation part 2122. The radome 211 is fixedly connected to the insulation part 2121, and a lower edge of the radome 211 is combined with an upper edge of the insulation part 2121 in a sealed manner, so as to ensure airtightness of the connection between the insulation part 2121 and the radome 211.

In specific implementation, the radome 211 and the insulation part 2121 may be connected in a plurality of forms. For example, as shown in FIG. 3, in an embodiment provided in this application, the radome 211 is connected to the insulation part 2121 by using a clamping structure. Specifically, a protrusion 2111 may be disposed in the radome 211, and a buckle 2123 may be disposed in the insulation part 2121. When the radome 211 is connected to the insulation part 2121, the protrusion 2111 in the radome 211 and the buckle 2123 in the insulation part 2121 are fastened to each other, so that the radome 211 is fixedly connected to the insulation part 2121. In specific implementation, a quantity and positions of protrusions 2111 may be diversified. In addition, a quantity and positions of buckles 2123 may be adaptively adjusted based on the quantity and the positions of the protrusions 2111. In addition, in some implementations, the radome 211 may alternatively be fixedly connected to the insulation part 2121 in a form of bonding, threaded connection, welding, or the like. This is not specifically limited in this application.

In addition, to ensure airtightness of the connection between the radome 211 and the insulation part 2121, as shown in FIG. 3, in this embodiment provided in this application, a groove 2127 is disposed on an upper edge of the insulation part 2121, and a flange 2112 is disposed on a lower edge of the radome 211. When the radome 211 and the insulation part 2121 are fastened to each other, the flange 2112 in the radome 211 is embedded into the groove 2127 in the insulation part 2121, and the flange 2112 may closely press against an inner wall of the groove 2127, so as to ensure airtightness of the connection between the radome 211 and the insulation part 2121.

In some implementations, to improve airtightness of the connection between the radome 211 and the insulation part 2121, a sealing ring may be disposed between the radome 211 and the insulation part 2121. Specifically, the sealing ring may be disposed in the groove 2127. After the radome 211 and the insulation part 2121 are fastened to each other, the flange 2112 in the radome 211 is embedded into the groove 2127 in the insulation part 2121 and closely presses against the sealing ring. At the same time, the flange 2112 presses the sealing ring, so that the sealing ring closely presses against the inner wall of the groove 2127, thereby improving airtightness of the connection between the insulation part 2121 and the radome 211. In some other implementations, a joint (for example, between the flange 2112 and the groove 2127) between the radome 211 and the insulation part 2121 may be filled with sealant or the like, to ensure airtightness of the connection between the radome 211 and the insulation part 2121. In some other implementations, the flange 2112 may be disposed at the upper edge of the insulation part 2121, and the groove 2127 may be disposed at the lower edge of the radome 211.

In addition, in some implementations, the radome 211 and the insulation part 2121 may alternatively be an integrated structure. Specifically, the radome 211 and the insulation part 2121 may be integrally formed by using an injection molding process or the like. For example, the radome 211 and the insulation part 2121 may be injected and molded by using materials such as resin, vinyl cyanide, polyethylene, polypropylene, and polycarbonate. In specific implementation, the radome 211 and the insulation part 2121 may use a same insulation material or different insulation materials.

Figure 7:
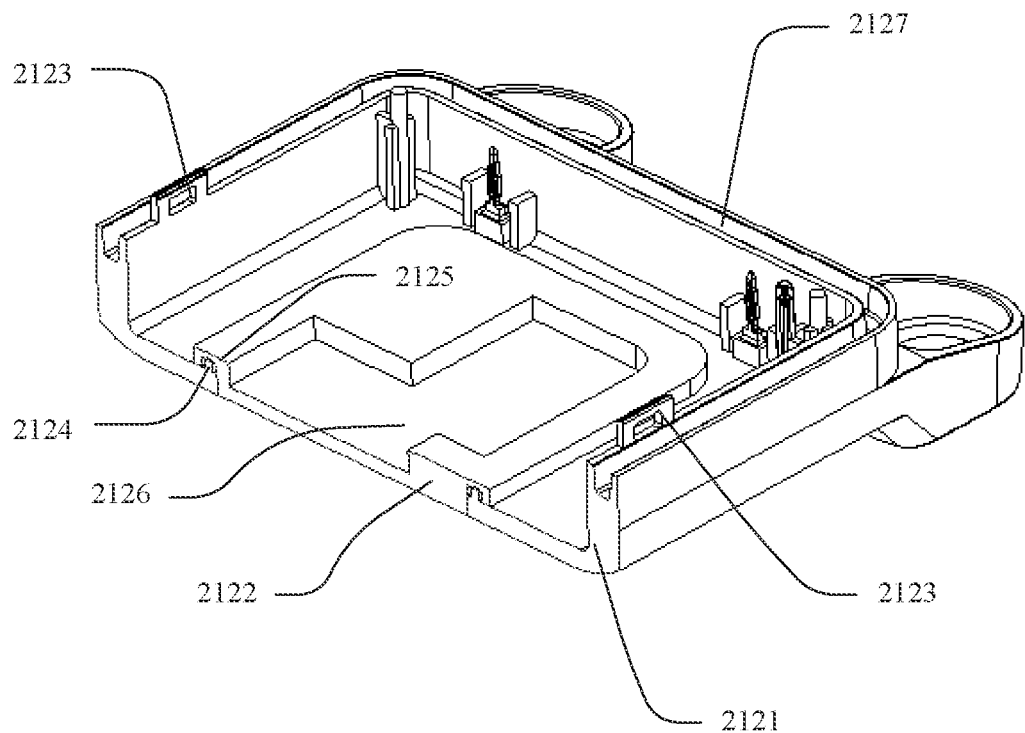
FIG. 7 is a sectional view of a bottom housing according to an embodiment of this application.
Figure 8:
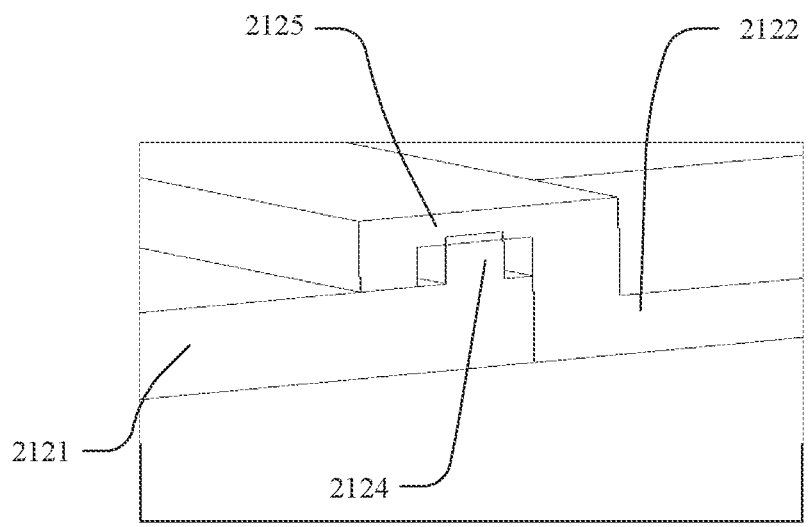
FIG. 8 is a diagram of a partial interface of a bottom housing according to an embodiment of this application.

In specific implementation, the insulation part 2121 may be connected to the metal heat dissipation part 2122 in various forms. For example, as shown in FIG. 7, in an embodiment provided in this application, the insulation part 2121 may include a first connection part 2124, the metal heat dissipation part 2122 may include a second connection part 2125, and the insulation part 2121 may be connected to the metal heat dissipation part 2122 in a sealed manner by using the first connection part 2124 and the second connection part 2125. With reference to FIG. 8, in an embodiment provided in this application, the first connection part 2124 may be of a flange structure, and the second connection part 2125 may be of a groove structure fitting the flange structure. Specifically, the flange structure may be disposed at an edge of the through hole (not marked in the figure) at the bottom of the insulation part 2121 and disposed upward, and the groove structure may be disposed at an edge of the metal heat dissipation part 2122 and disposed downward. When the insulation part 2121 is fixedly connected to the metal heat dissipation part 2122, the metal heat dissipation part 2122 may be placed in the insulation part 2121 to embed the flange structure into the groove structure, and then the flange structure or the groove structure is heated by using a laser welding process or the like, to melt the flange structure gradually. After cooling, the insulation part 2121 and the metal heat dissipation part 2122 (the flange structure and the groove structure) can be connected in a sealed manner. In some implementations, the flange structure may alternatively be disposed in the metal heat dissipation part 2122, and the groove structure may be disposed in the insulation part 2121. In addition, in some implementations, a gap between the flange structure and the groove structure may be filled with a hot melt adhesive, a sealing ring, or the like, to ensure airtightness of the connection between the insulation part 2121 and the metal heat dissipation part 2122.

In addition, in some implementations, the insulation part 2121 and the metal heat dissipation part 2122 may alternatively be connected in a sealed manner by using another connection structure. For example, the insulation part 2121 and the metal heat dissipation part 2122 may be connected by using the connection structure between the radome 211 and the insulation part 2121 in the foregoing embodiments, or may be connected by using a threaded connection (for example, a screw). For example, a protrusion may be disposed in the insulation part 2121, and a buckle may be disposed in the metal heat dissipation part 2122. When the insulation part 2121 is connected to the metal heat dissipation part 2122, the protrusion in the insulation part 2121 and the buckle in the metal heat dissipation part 2122 are fastened to each other, so that the insulation part 2121 is fixedly connected to the metal heat dissipation part 2122. In addition, the radome 211 and the insulation part 2121 may also be connected in a sealed manner by using the connection structure between the insulation part 2121 and the metal heat dissipation part 2122, or may be connected in a sealed manner by using another connection structure. For example, a groove structure and a flange structure may be disposed at a part at which the insulation part 2121 is in contact with the metal heat dissipation part 2122. After the insulation part 2121 and the metal heat dissipation part 2122 are fastened to each other, the groove (or the flange) in the insulation part 2121 fits the flange (or the groove) in the metal heat dissipation part 2122, so that the insulation part 2121 is connected to the metal heat dissipation part 2122 in a sealed manner.

In addition, in some implementations, the metal heat dissipation part 2122 and the insulation part 2121 may alternatively be an integrated structure. Specifically, the radome 211 and the insulation part 2121 may be integrally formed by using an injection molding process or the like. For example, the metal heat dissipation part 2122 may be first molded by using an injection molding process, a stamping process, or the like, then the molded metal heat dissipation part 2122 is placed in an injection mold, and an insulation material is injected into the mold to mold the insulation part 2121, so as to combine the insulation part 2121 and the metal heat dissipation part 2122.

In some implementations, a specific shape and a disposing position of the metal heat dissipation part 2122 may be correspondingly adjusted according to an actual heat dissipation requirement.

For example, in this embodiment provided in this application, the circuit board 221 in the antenna board 22 is of a rectangular structure. In specific implementation, to reduce a volume of the housing 21 as much as possible, the housing 21 may be of a rectangular cube structure. In addition, the metal heat dissipation part 2122 may also be of a rectangular board structure, so that the metal heat dissipation part 2122 can have a good heat dissipation effect on the antenna board 22. In specific implementation, the metal heat dissipation part 2122 may be disposed right below the circuit board 221, so that heat generated by the antenna board 22 can be effectively radiated or transferred to the metal heat dissipation part 2122, thereby effectively improving the heat dissipation effect of the metal heat dissipation part 2122 on the antenna board 22. In some implementations, a contour area of the antenna board 22 may be not greater than a contour area of the metal heat dissipation part 2122, so that heat generated by the antenna board 22 can be effectively radiated or transferred to the metal heat dissipation part 2122, thereby improving the heat dissipation effect of the metal heat dissipation part 2122 on the antenna board 22. In some other implementations, to transfer heat generated by the antenna board 22 to the metal heat dissipation part 2122 more efficiently, a distance between the antenna board 22 and the metal heat dissipation part 2122 may be shortened as much as possible, or a heat conduction member may be disposed between the antenna board 22 and the metal heat dissipation part 2122. For example, a material such as heat conduction silicon gel may be disposed between a lower side of the circuit board 221 and an upper side of the metal heat dissipation part 2122, so that the heat generated by the antenna board 22 can be efficiently transferred to the metal heat dissipation part 2122, thereby improving heat dissipation performance of the millimeter-wave radar apparatus 20. In addition, to improve heat dissipation performance of the metal heat dissipation part 2122, in some implementations, a structure such as a heat dissipation fin may be disposed in the metal heat dissipation part 2122, so as to increase a heat exchange area between the metal heat dissipation part 2122 and the outside, thereby effectively improving the heat dissipation performance of the metal heat dissipation part 2122. Specifically, a platy structure, a prismatic structure, a columnar structure, or the like may be disposed on an outer side of the metal heat dissipation part 2122 to form the heat dissipation fin, thereby increasing the heat exchange area between the metal heat dissipation part 2122 and the outside.

In addition, in an actual application, some electronic elements or heat emitting elements (such as a controller) may be disposed on a lower board surface of the circuit board 221. Refer to FIG. 3. To effectively improve the heat dissipation performance of the millimeter-wave radar apparatus 20, in an embodiment provided in this application, an accommodation groove 2126 may be disposed in the metal heat dissipation part 2122, so that some electronic elements located on the lower board surface of the circuit board 221 may be accommodated in the accommodation groove 2126, thereby facilitating miniaturization of the millimeter-wave radar apparatus 20. In addition, a distance between the metal heat dissipation part 2122 and the electronic element and a distance between the metal heat dissipation part 2122 and the circuit board 221 can be effectively reduced, so as to reduce a heat conduction distance between the metal heat dissipation part 2122 and each of the circuit board 221 and the electronic element, thereby improving the heat dissipation performance of the millimeter-wave radar apparatus 20. In specific implementation, shapes, contours, sizes, and a quantity of accommodation grooves 2126 may be correspondingly adjusted according to an actual requirement. This is not specifically limited in this application.

In some implementations, some electronic elements may be disposed on an additional circuit board 221. For example, the millimeter-wave radar apparatus 20 may alternatively include a multilayer board structure. Specifically, an independent circuit board may be disposed on a lower side of the antenna board 22, so as to install the electronic element, and prevent the circuit board from blocking or interfering with the electromagnetic wave from the antenna board 22. In specific implementation, the circuit board may include components such as a drive circuit and a controller. The circuit board may be electrically connected to the antenna board 22, so as to drive the antenna element 222 to transmit an electromagnetic wave, or perform operations such as processing and calculation on an electromagnetic wave received by the antenna element 222.

In addition, in some implementations, the metal heat dissipation part 2122 may not be limited to being disposed at the lower part of the bottom housing 212, but may be disposed at a side part of the bottom housing 212 (or the insulation part 2121). For example, some side boards of the bottom housing 212 may be made of a metal material.

In addition, to facilitate signal transmission and power transmission between the millimeter-wave radar apparatus 20 and an external device, a connector 2128 may be disposed at the housing 21.

As shown in FIG. 3, in an embodiment provided in this application, the connector 2128 is disposed on a side part of the bottom housing 212. Specifically, the connector 2128 may include a plastic housing and an electrical connection structure (for example, a metal contact, a spring, or a pin) disposed in the plastic housing.

To prevent a metal part in the connector 2128 from interfering with normal working of the antenna board 22, the connector 2128 may be disposed at the rear end of the antenna board 22. In addition, that the connector 2128 is disposed at the rear end of the antenna board 22 can further prevent from opening a gap on the antenna board 22 to avoid the connector 2128, thereby effectively increasing a board disposing area of the antenna board 22 (for example, the circuit board 221), and miniaturizing a plane size of an entire module. Specifically, refer to FIG. 4. The front end and the rear end of the antenna board 22 may be distinguished by using a dashed line in the figure as a boundary. That is, a part above the dashed line may be the front end of the antenna board 22, and a part below the dashed line (including a lower side, a left side, and a right side) may be the rear end of the antenna board 22. The connector 2128 may be disposed at the rear end of the antenna board 22. Specifically, the connector 2128 may be disposed on a left side or a lower side of the bottom housing 212. In specific implementation, in order to improve airtightness of a connection between the connector 2128 and the bottom housing 212, the connector 2128 and the bottom housing 212 may be made into an integrated structure by using an injection molding process. For ease of manufacturing, the connector 2128 and the insulation part 2121 in the bottom housing 212 are integrally injected molded. For example, the finished connector 2128 may be placed in an injection mold, and then an insulation material is injected into the mold, so as to implement molding of the insulation part 2121 and a connection between the insulation part 2121 and the connector 2128. This manner can effectively improve airtightness of the connection between the connector 2128 and the bottom housing 212, and facilitate mass production, thereby helping reduce manufacturing costs.

In addition, in specific implementation, the connector 2128 may be electrically connected to the antenna board 22 through a cable, or the connector 2128 may be directly connected to the antenna board 22.

For example, the connector 2128 is directly connected to the antenna board 22. As shown in FIG. 3, in an embodiment provided in this application, the electrical connection structure 2129 in the connector 2128 is a spring. A conductive structure (not shown in the figure) such as a pad or a metal contact is disposed on a lower board surface of the antenna board 22. After the antenna board 22 is installed downward in the housing 21, the spring (the electrical connection structure 2129) is in elastic contact with the pad or the metal contact on the lower board surface of the antenna board 22, so that the connector 2128 is electrically connected to the antenna board 22.

Figure 5:
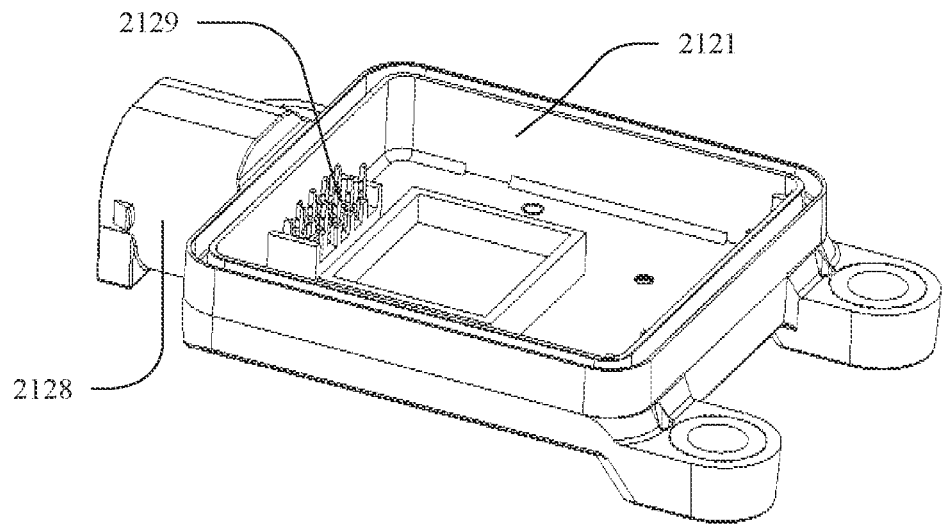
FIG. 5 is an exploded view of a part of a structure of another millimeter-wave radar apparatus according to an embodiment of this application.

Alternatively, refer to FIG. 5. In another embodiment provided in this application, the electrical connection structure 2129 in the connector 2128 is a pin. A via (not shown in the figure) is disposed on the lower board surface of the antenna board 22. After the antenna board 22 is installed downward in the housing 21, the pin (the electrical connection structure 2129) is plugged into the via on the lower board surface of the antenna board 22, so that the connector 2128 is electrically connected to the antenna board 22.

It may be understood that, in another embodiment, a type, a shape, and a construction of the electrical connection structure in the connector 2128 may be flexibly set according to different requirements. Correspondingly, a type, a shape, and a construction of the conductive structure in the antenna board 22 may also be flexibly set according to different requirements. This is not limited in this application.

In addition, in specific implementation, distribution of the insulation part 2121 and the metal heat dissipation part 2122 in the bottom housing 212 may be diversified. For example, a part of the bottom part and the side part of the bottom housing 212 may be the insulation part 2121, or the left side or a part of the left side of the bottom housing 212 may be the insulation part 2121, and other parts are the metal heat dissipation part 2122. The insulation part 2121 and the metal heat dissipation part 2122 are disposed, so that the connector 2128 can be combined with the bottom housing 212 (the insulation part 2121) by using an injection molding process. The connector 2128 can also be connected to the metal heat dissipation part 2122 in a sealed manner by using the insulation part 2121, so as to ensure airtightness of the bottom housing 212.

Figure 9:
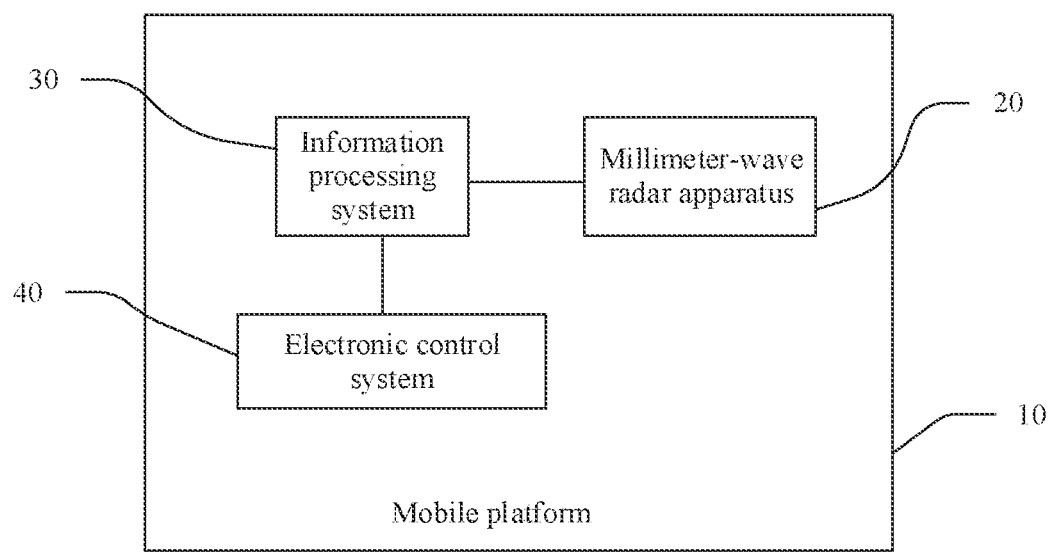
FIG. 9 is a block diagram of a structure of a mobile platform according to an embodiment of this application.

On the other hand, as shown in FIG. 9, an embodiment of this application further provides a mobile platform 10, including an information processing system 30 and the millimeter-wave radar apparatus 20 in any one of the foregoing embodiments. The information processing system 30 is configured to determine characteristic information of a detected object based on an electromagnetic wave generated by the millimeter-wave radar apparatus 20 and a received electromagnetic wave, where the characteristic information includes but is not limited to information such as a target distance, an orientation, a height, a speed, a posture, and even a shape. Specifically, the information processing system 30 may accurately measure propagation time from transmitting an electromagnetic wave by the millimeter-wave radar apparatus 20 to receiving the electromagnetic wave reflected by the target object. Because a light speed is known, the propagation time may be converted into measurement of a distance. Therefore, a distance from the millimeter-wave radar apparatus 20 to the target object is determined.

In specific implementation, the information processing system 30 may be a hardware apparatus in various forms, such as a processor, a microprocessor (for example, a digital signal processor, DSP), an AI chip (for example, a Field Programmable Gate Array, FPGA), and an application-specific integrated circuit (for example, an Application-Specific Integrated Circuit, ASIC).

For example, the mobile platform 10 is an autonomous driving vehicle. The autonomous driving vehicle includes the millimeter-wave radar apparatus 20, the information processing system 30, and an electronic control system 40. The electronic control system 40 (electronic control Unit, ECU) may be a vehicle-mounted computer. When the millimeter-wave radar apparatus 20 identifies that an obstacle exists ahead, and the information processing system 30 calculates characteristic information of the obstacle, the electronic control system 40 may control, based on the characteristic information of the obstacle and with reference to navigation information (such as a map), a drive apparatus in the autonomous driving vehicle to decelerate, stop, or turn around; or when the millimeter-wave radar apparatus 20 and the information processing system 30 determine that no obstacle exists, the electronic control system 40 may control, based on the foregoing information indicating that no obstacle exists, a drive apparatus in the autonomous driving vehicle to travel at a uniform speed or travel at an accelerated speed.

In an optional embodiment, a specific type of the mobile platform 10 is not limited. For example, the mobile platform 10 may be a mobile platform such as a vehicle, a ship, an airplane, a train, a spacecraft, or an unmanned aerial vehicle, and is applicable to the technical solutions of this application.

The foregoing descriptions are merely specific implementations of this application, but are not intended to limit the protection scope of this application. Any variation or replacement readily figured out by a person skilled in the art within the technical scope disconnected in this application shall fall within the protection scope of this application.

What is claimed is:

1. A radar apparatus, comprising:
   a housing having accommodation space, wherein the housing comprises a bottom housing, wherein the bottom housing comprises an insulation part and a metal heat dissipation part, and wherein the insulation part comprises a through hole, and the metal heat dissipation part blocks the through hole;
   an antenna board, disposed in the accommodation space, wherein the antenna board has a first board surface and a second board surface that are disposed opposite each other, and the first board surface is used to receive and transmit signals; and
   a connector, disposed at the housing and configured to connect to another component outside the housing, wherein:
   the connector has an electrical connection structure;
   the electrical connection structure is electrically connected to the antenna board; and
   the electrical connection structure is located on a side of the second board surface.

2. The radar apparatus according to claim 1, wherein the electrical connection structure is a metal contact, a spring, or a pin.

3. The radar apparatus according to claim 1, wherein the second board surface has a pad or via for connecting to the electrical connection structure.

4. The radar apparatus according to claim 1, wherein the housing comprises:
   a radome, fixedly connected to the bottom housing, wherein:
   the bottom housing and the radome form airtight accommodation space; and
   the first board surface of the antenna board is disposed facing the radome, and the metal heat dissipation part is on the side of the second board surface.

5. The radar apparatus according to claim 4, wherein a housing of the connector and the insulation part are integrally formed.

6. The radar apparatus according to claim 5, wherein the connector is disposed on a side part of the bottom housing.

7. The radar apparatus according to claim 4, wherein:
   the insulation part comprises a first connection part;
   the metal heat dissipation part comprises a second connection part; and
   the first connection part and the second connection part are connected in a sealed manner.

8. The radar apparatus according to claim 7, wherein the first connection part comprises a groove structure or a flange structure, and the second connection part comprises a flange structure or a groove structure that fits the first connection part.

9. The radar apparatus according to claim 8, wherein:
   the insulation part comprises a bottom board and a side board located at an edge of the bottom board, the bottom board is provided with the through hole, and the first connection part is disposed at an edge of the through hole; and
   the second connection part is located at an edge of the metal heat dissipation part.

10. The radar apparatus according to claim 9, wherein the connector is disposed on a side part of the bottom housing.

11. The radar apparatus according to claim 7, wherein:
    the insulation part comprises a bottom board and a side board located at an edge of the bottom board, the bottom board is provided with the through hole, and the first connection part is disposed at an edge of the through hole; and
    the second connection part is located at an edge of the metal heat dissipation part.

12. The radar apparatus according to claim 4, wherein the connector is disposed on a side part of the bottom housing.

13. The radar apparatus according to claim 4, wherein the metal heat dissipation part is disposed directly facing the second board surface of the antenna board.

14. The radar apparatus according to claim 13, wherein a contour area of the antenna board is not greater than a contour area of the metal heat dissipation part.

15. The radar apparatus according to claim 4, wherein:
    an inner side of the metal heat dissipation part has an accommodation groove; and
    the accommodation groove is configured to accommodate a heat emitting element in the radar apparatus.

16. The radar apparatus according to claim 4, wherein a heat conduction member is disposed between the metal heat dissipation part and an antenna assembly.

17. A mobile platform, comprising an information processing system and a radar apparatus, wherein:
    the information processing system is signal-connected to the radar apparatus, and the information processing system is configured to calculate characteristic information of a detected object based on a signal from the radar apparatus; and the radar apparatus comprises:
- a housing having accommodation space, wherein the housing comprises a bottom housing, wherein the bottom housing comprises an insulation part and a metal heat dissipation part, and wherein the insulation part comprises a through hole, and the metal heat dissipation part blocks the through hole;
- an antenna board, disposed in the accommodation space, wherein the antenna board has a first board surface and a second board surface that are disposed opposite each other, and the first board surface is used to receive and transmit signals; and
- a connector, disposed at the housing and configured to connect to another component outside the housing, wherein:
  - the connector has an electrical connection structure;
  - the electrical connection structure is electrically connected to the antenna board; and
  - the electrical connection structure is located on a side of the second board surface.

18. The mobile platform according to claim 17, wherein the housing comprises:
- a radome, fixedly connected to the bottom housing, wherein:
  - the bottom housing and the radome form airtight accommodation space; and
  - the first board surface of the antenna board is disposed facing the radome, and the metal heat dissipation part is on the side of the second board surface.

19. The mobile platform according to claim 18, wherein a housing of the connector and the insulation part are integrally formed.

20. The mobile platform according to claim 18, wherein:
- the insulation part comprises a first connection part;
- the metal heat dissipation part comprises a second connection part; and
- the first connection part and the second connection part are connected in a sealed manner.

* * * * *